US006828875B2

(12) United States Patent
Channabasappa et al.

(10) Patent No.: US 6,828,875 B2
(45) Date of Patent: Dec. 7, 2004

(54) COMPACT SLOTTED-WAVEGUIDE SPATIAL POWER DIVIDER/COMBINER/AMPLIFIER

(75) Inventors: Eswarappa Channabasappa, Acton, MA (US); Thongchai Hongsmatip, Lunenburg, MA (US); Noyan Kinayman, Malden, MA (US); Richard Alan Anderson, North Attleborough, MA (US); Bernhard A. Ziegner, Tyngsborough, MA (US)

(73) Assignee: MIA-Com, Inc., Lowell, MA (US)

( * ) Notice: Subject to any disclaimer, the term of this patent is extended or adjusted under 35 U.S.C. 154(b) by 17 days.

(21) Appl. No.: 10/315,528

(22) Filed: Dec. 9, 2002

(65) Prior Publication Data

US 2004/0108903 A1 Jun. 10, 2004

(51) Int. Cl.[7] .............................. H01P 5/12; H03F 3/60; H03F 3/68
(52) U.S. Cl. ......................... 333/137; 333/34; 333/286; 333/295
(58) Field of Search ................................ 333/125, 136, 333/137, 26, 34; 330/286, 295

(56) References Cited

U.S. PATENT DOCUMENTS 6,639,484 B2 * 10/2003 Tzuang et al. ............ 333/21 R

FOREIGN PATENT DOCUMENTS

JP            8-148913      *  6/1996

OTHER PUBLICATIONS

R. Bashirullah et al., "A Slotted Waveguide Quasi–Optical Power Amplifier"; Microwave Symposium Digest, 1999 IEEE MTT–S International; Jun. 1999, vol. 2, pp. 671–674.*

R. Bashirullah and A. Mortazawi, "A Slotted–Waveguide Power–Combining Amplifier for Spatial Power–Combining Power Applications," IEEE Trans. on MTT, vol. 48, No. 7, Jul. 2000, pp. 1142–1147.

E.W. Bryerton, M.D. Weiss and Z. Popovic "Efficiency of Chip–Level Versus External Power Combining," IEEE Trans. on MTT, vol. 47, No. 8, Aug. 1999, pp. 1482–1485.

N. Cheng, A. Alxanian, M.G. Case, D.B. Rensch and R.A. York, "40–W CW Broad–Band SpatiaL Power Combiner Using Dense Finline Arrays," IEEE Trans. on MTT, vol. 47, No. 7, Jul. 1999, pp. 1070–1076.

J. Hubert, L. Mirth, S. Ortiz, and A. Mortazawi, "A 4 Watt Ka–band Quasi–Optical Amplifier," 1999 IEEE MTT–S Digest, Jun. 1999, vol. 2, pp. 551–554.

P. Yia, Y. Liu, L. Chen and R.A. York, "Analysis of a Passive Spatial Combiner Using Tapered Slot Line Array in Oversized Coaxial Waveguide," 2000 IEEE MTT–S Digest, Jun. 2000, vol. 3, pp. 1933–1936.

* cited by examiner

Primary Examiner—Barbara Summons

(57) ABSTRACT

A spatial power divider/combiner that comprises: a housing containing a first channel forming three sides of a rectangular input waveguide and a second channel forming three sides of a rectangular output waveguide; a board coupled to the housing, wherein the underside of the board forms the fourth side of the input and output waveguides; a series of slots etched on the underside of the board located in the input waveguide to divide an input signal; a series of slots etched on the underside of the board located in the output waveguide to recombine the divided signal; and a series of microstrip lines printed on the top side of the board to couple the input waveguide and the output waveguide. Additionally, the divider/combiner can comprise a series of active devices, such as MMIC power amplifier, to provide a spatial power amplifier.

29 Claims, 6 Drawing Sheets

COMPACT SLOTTED-WAVEGUIDE SPATIAL POWER DIVIDER/COMBINER/AMPLIFIER

FIELD OF THE INVENTION

The present invention relates to amplifiers and power divider/combiners, and more specifically to spatial power divider/combiners operating in the millimeter wave frequency band.

BACKGROUND OF THE INVENTION

Recent growth in wireless communication systems has resulted in an increased use of devices operating in the millimeter-wave spectrum. Newly developed wireless communication systems such as Local Multipoint Distribution Service (LMDS) utilize millimeter-wave devices extensively. These systems use medium and high power solid state amplifiers operating in the millimeter-wave spectrum.

While the use of devices operating in this frequency band provides many advantages, one shortcoming of millimeter-wave devices is that they have a very modest power output. Currently, commercially available devices such as monolithic microwave integrated circuits (MMIC) are limited in output power over the millimeter-wave spectrum to approximately one Watt.

In order to achieve higher power outputs, several MMIC devices need to be combined. Power combination has traditionally been achieved using combiner circuits, known as corporate power combiners. FIG. 1a illustrates a corporate power combiner. The power combination is achieved using a series of two-way adders (e.g., Wilkinson combiners). To combine eight inputs, a three stage corporate combiner circuit is used. In the first stage, each of the eight inputs are combined with another input using a series of two-way adders (10a, 10b, 10c, 10d), yielding a total of four outputs (12a, 12b, 12c, 12d). In the second stage, each of these outputs are then paired with another output and a second stage of combination is performed using a second series of two way adders (13a, 13b). Finally, in the third stage, the two outputs (14a, 14b) from the second series of two way adders (13a, 13b) are combined in an additional adder 15 to generate a single combined output 16.

While corporate power combiners allow for the combination of several low power MMIC device outputs, such circuits are subject to high loss levels. The efficiency of a corporate power combiner can be represented by:

$$\text{total efficiency } (\eta) = 10^{-nL/10}$$

where:
L=loss per stage in decibels;
n=number of stages.

The total number of two way adders used in a corporate power combiner circuit increases as the number of stages in the combiner increases, with the total number of adders in a combiner circuit equal to $2^n$.

The efficiency in a corporate power combiner circuit decreases exponentially as the number of elements combined increases. Because of their low efficiency, the benefits of using of corporate power combiners to combine MMICs are limited.

To improve efficiency, spatial combining techniques have been developed, as illustrated in FIG. 1b. In a spatial combiner, the output of each amplifier 17 is connected to an antenna 18, as shown in FIG. 1b. The antenna transmits the output from the amplifier, and the combining occurs in a spatial electromagnetic field in free space in a single stage. As a result, the efficiency of the combiner is independent of the number of devices being combined. In addition, because a spatial combiner does not contain lossy transmission lines as are used in a corporate combiner, the efficiency of a spatial combiner is significantly higher.

However, despite being more efficient than traditional corporate combiners, spatial combiners still have several drawbacks. Several different spatial combiner techniques have been used to combine signals, but none of these techniques are suited for power combining in the frequency range of 24–36 GHz. Spatial combiners using finline antenna arrays in rectangular waveguides have been used with signals having frequencies up to 10 GHz, but at 28 GHz the cross-section of the waveguide is too small to accommodate finline antenna arrays and devices. Flared coaxial spatial power combiners have been developed which utilize a circular casing loaded with tapered slotline array cards to combine signals with frequencies up to 16 GHz. These devices, however, are very complicated to construct and are space consuming, often ranging up to approximately fourteen inches in length. Spatial combiners using a series of wafers containing patch antennas located between a pair of horn antennas have been used to attempt to combine higher frequency signals. These devices, however, suffer from high rates of power dissipation as the signal traverses the wafer layers. In addition, because of the high rates of power dissipation, it is difficult to provide an effective thermal path in these devices.

Accordingly, there is a need for a power combiner that can be used with high frequency signals (e.g., 28 GHz), has a high level of efficiency, a simple structure, a low profile, an efficient thermal diffusion path, and can be easily and cost effectively manufactured. The present invention fulfills this need among others.

SUMMARY OF THE INVENTION

The present invention provides for a spatial power divider/combiner capable of combining high frequency signals. The spatial power divider/combiner in accordance with the present invention provides highly efficient signal combining using a device with a simple structure, low profile, and that can be easily manufactured at a low cost. The present invention provides for both a passive spatial power divider/combiner and an active spatial power divider, or amplifier. A divider/combiner which does not contain any active devices is referred to as a passive divider/combiner, while a divider/combiner whereby the signals are processed (e.g., the signals are amplified) using active devices is referred to as an active divider/combiner, or amplifier.

The spatial power divider/combiner in accordance with the present invention uses a small, simple, rectangular structure. It has a low profile, utilizing a body of less than four inches in length and less than two and one-half inches in width, with a height of less than one inch. The spatial power divider/combiner in accordance with the present invention uses a plurality of slots in an input waveguide to divide the input power into a plurality of equal signals at the same phase. The slots are coupled to microstrip lines to provide a path for the signals to travel to a slotted output waveguide which is identical to the slotted input waveguide. The signals are combined into a single output signal in the slotted output waveguide.

Active devices such as low power solid state MMIC power amplifier devices can be inserted in the path of the microstrip lines to amplify the divided signals prior to recombination.

One aspect of the present invention is a passive spatial power divider/combiner that comprises: a housing containing a first channel forming three sides of a rectangular input waveguide and a second channel forming three sides of a rectangular output waveguide; a board coupled to the housing, wherein the underside of the board forms the fourth side of the input and output waveguides; a series of slots etched on the underside of the board located in the input waveguide to divide an input signal; a series of slots etched on the underside of the board located in the output waveguide to recombine the divided signal; and a series of microstrip lines printed on the top side of the board to couple the input waveguide and the output waveguide.

A second aspect of the present invention is an active spatial power amplifier that comprises: a housing containing a first channel forming three sides of a rectangular input waveguide and a second channel forming three sides of a rectangular output waveguide; a first board coupled to the housing, wherein the underside of the first board forms the fourth side of the input waveguide; a second board coupled to the housing, wherein the underside of the second board forms the fourth side of the output waveguide; a series of slots etched on the underside of the first board located in the input waveguide to divide an input signal; a series of slots etched on the underside of the second board located in the output waveguide to recombine the divided signal; a series of active devices located along the microstrip lines for signal amplification, a series of microstrip lines printed on the top side of the first board to couple the slots in the input waveguide to the active devices, and a series of microstrip lines printed on the top side of the second board to couple the active devices to the slots in the output waveguide.

BRIEF DESCRIPTION OF THE DRAWINGS

FIG. 2b is a cross-sectional view (cut along lines A—A) of the divider/combiner shown in FIG. 2a.

DETAILED DESCRIPTION OF THE INVENTION

Figure 1A:
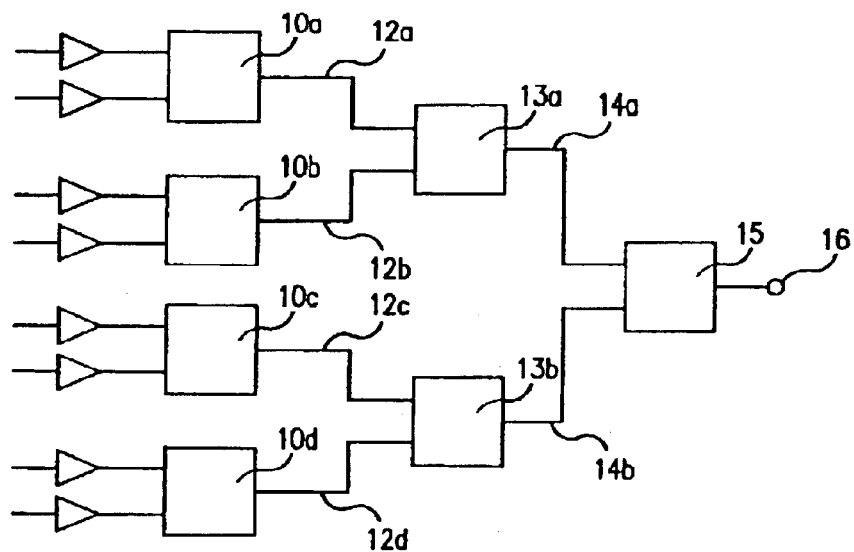
FIG. 1a is shows the structure of a corporate power combiner in accordance with the prior art.
Figure 1B:
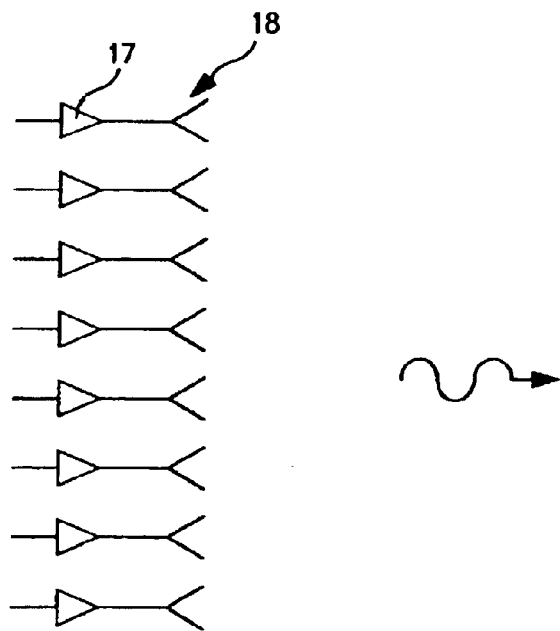
FIG. 1b shows the structure of a spatial power combiner in accordance with the prior art.
Figure 2A:
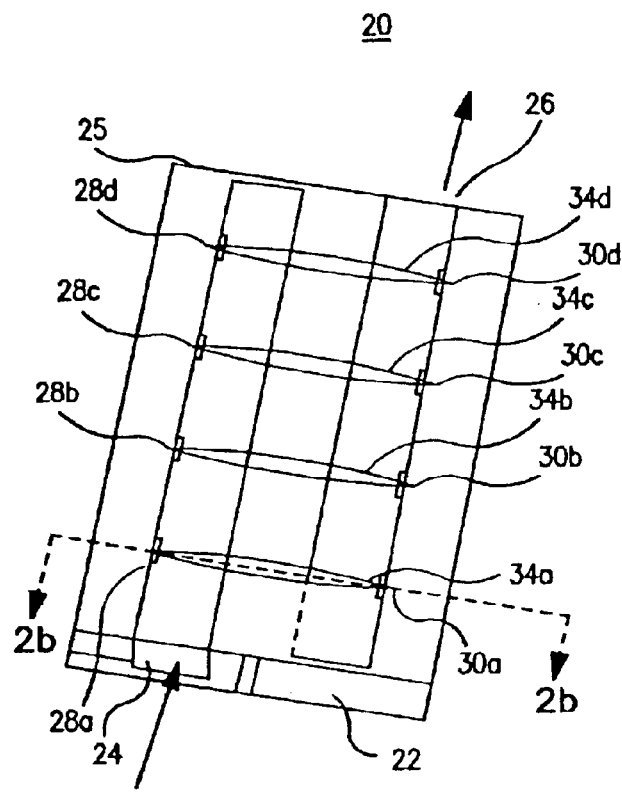
FIG. 2a is an "x-ray" view of the structure of a passive spatial power divider/combiner in accordance with the present invention.
Figure 2B:
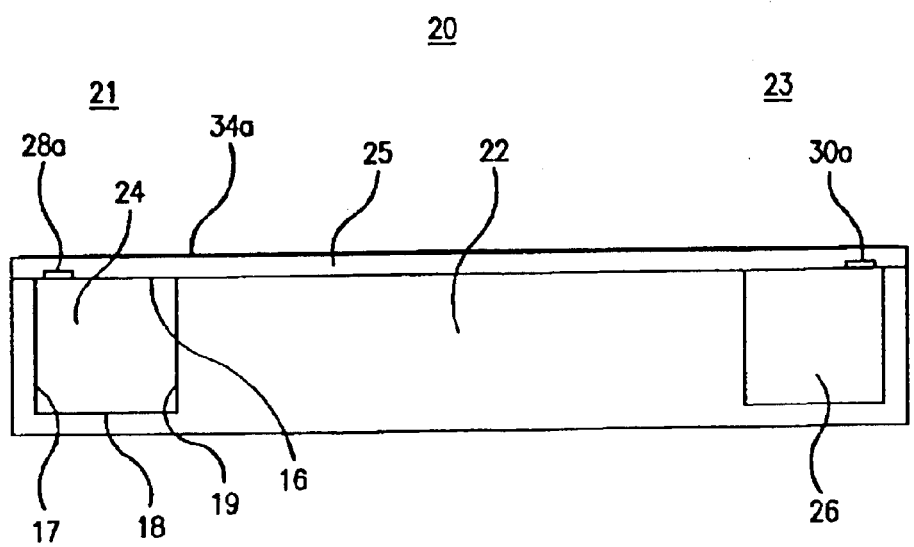
Figure 3:
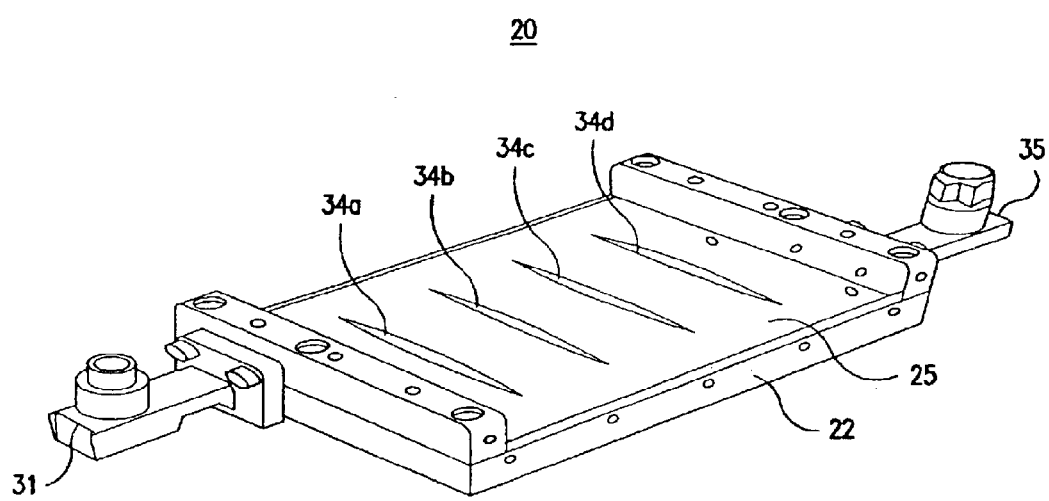
FIG. 3 is a perspective view of a passive spatial power divider/combiner in accordance the present invention, shown in the assembled state.

Referring to FIGS. 2a, 2b, and 3, the structure of a passive spatial power divider/combiner ("passive divider/combiner") in accordance with a preferred embodiment the present invention is illustrated. FIG. 2a shows an x-ray view of the passive divider/combiner, FIG. 2b shows a cross-sectional view of the passive divider/combiner, and FIG. 3 is a perspective view of the passive-divider/combiner fully assembled.

Referring to FIG. 2b, the passive divider/combiner 20 comprises a housing 22. The housing 22 is preferably made of aluminum, although other materials can be used. Aluminum is a preferred material for the housing because it is lightweight and can be easily machined.

An input waveguide 24 is formed on one half 21 of the passive divider/combiner 20. An output waveguide 26 is formed on the opposite half 23 of the passive combiner 20. Three sides (17,18,19) of the input waveguide 24 and the output waveguide 26 are formed by machining channels into the housing 22. The fourth side or top side 16 of the each waveguide is formed when a board 25 is affixed to the top of the housing covering the machined channels. The board 25 comprises a substrate with a metal layer deposed on both the top and underside surfaces.

Referring to FIG. 2a, a series of slots (28a, 28b, 28c, 28d) are formed along the input waveguide 24, and a corresponding series of slots (30a, 30b, 30c, 30d) are formed along the output waveguide 26. The slots are formed on the underside of the board 25 used to create the top side of the waveguide. In a preferred embodiment, the slots (28a, 28b, 28c, 28d) are rectangular shaped recesses etched into the underside of the board 25. In a preferred embodiment, the slots (28a, 28b, 28c, 28d) are approximately 4.4 mm (173 mils) in length and 0.25 mm (10 mils) in width. The depth of the slots (28a, 28b, 28c, 28d) is sufficient to pass through the metal surface of the board into the substrate layer, which in a preferred embodiment is approximately 0.7 mil deep.

The slots (28a, 28b, 28c, 28d) form antennas in the input waveguide that serve as a power divider. An input signal traveling in the input waveguide 24 is divided into equal subsignals, each having the same phase, by the series of slots (28a, 28b, 28c, 28d). In the illustrated embodiment, four slots are used to divide the input signal into four equal signals, each having the same phase. However, other embodiments can use various numbers of slots to divide the signal into various numbers of equal subsignals.

The slots (30a, 30b, 30c, 30d) formed in the output waveguide 26 perform a combining function. The separate subsignals are combined, as known in the art, to form a single output signal, which exits the passive combiner 20 via the output waveguide 26.

The spacing between the slots in both the input waveguide 24 and the output waveguide 26 must be equal to a distance that is a multiple of half wavelengths of the input signal to achieve equal division. However, if a half wavelength increment is used (e.g., one half wavelength, one and one half wavelength, etc.), adjacent slots would need to be offest on different sides within each waveguide to account for an additional 180 degrees of phase shift. In a preferred embodiment, the spacing between the slots is equal to one wavelength for a 28 GHz millimeter-wave signal. By choosing one wavelength, 360 degrees of phase shift occurs and all of the slots can be on the same side of each waveguide.

FIG. 3 is a perspective view of the passive spatial power combiner 20 in the assembled state. Referring to FIG. 3, the board 25 is mounted on the housing 22. In a preferred embodiment, the board 25 is bonded to the housing 22 using conductive silver-filled filled epoxy, although other well known bonding methods can also be used. In a preferred embodiment, the board comprises a 0.029" thick layer of TLY-3 (Taconics, Inc., Petersburgh, N.Y.). Other substrates (e.g., Duriod 5870) can also be used to form the board 25. The substrate material is metalized on both the top and bottom surfaces. Preferably, a layer of copper approximately 0.7 mils in thickness is used to metalize the top and bottom surfaces of the board 25. Microstrip lines (34a, 34b, 34c, 34d) are formed on the top surface of the board 25. These microstrip lines couple the divided subsignals between the input waveguide 24 and the output waveguide 26.

Because all adjacent slots are separated by a distance of one wavelength, the equivalent input admittance to the array is the sum of all the individual slot admittances. In order to divide the signal equally (or recombine the signal in the case of the slots (30a, 30b, 30c, 30d) located in the output waveguide), all four waveguide-slot-microstrip conductances should be approximately equal (i.e., $g_1=0.25$). To achieve this result using the slot size described above, the shape of the microstrip lines (34a, 34b, 34c, 34d) is adjusted. The microstrip lines are formed in a tapered configuration to obtain the desired signal division, with the lines becoming narrower as the extend away from the center of the passive combiner 20.

Figure 4:
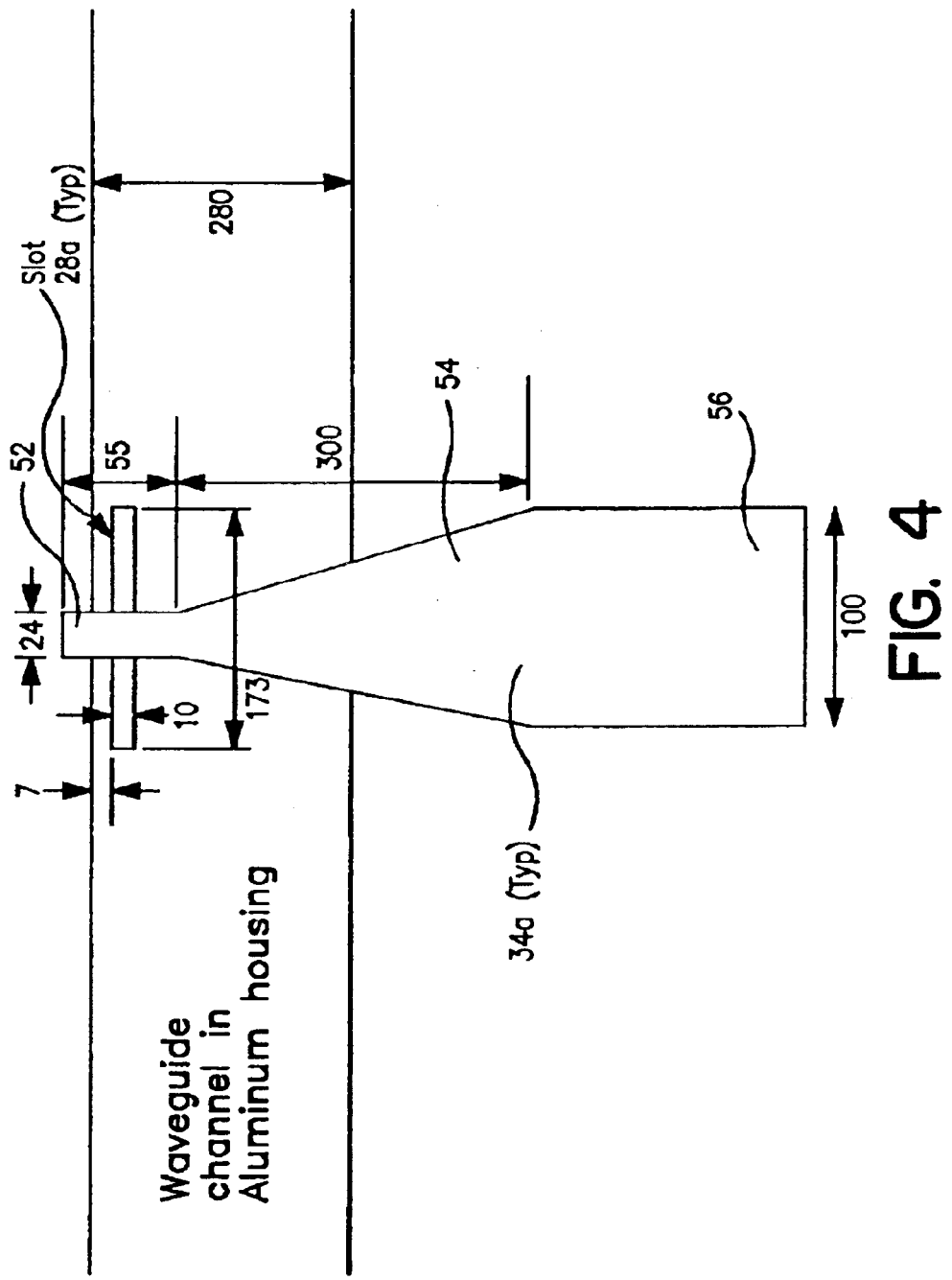
FIG. 4 is an exploded view showing the configuration used to achieve the waveguide-slot-microstrip transition.

For a preferred embodiment, an exploded view of the microstrip line 34a where it is coupled to a slot 28s is shown in FIG. 4. This representation is typical for all of the areas waveguide-slot-microstrip transition occurs. The slot 28a has a high impedance. Thus, in order to have an impedance match between the slot and the microstrip line 34a at the end 52 where the line is coupled to the slot, the microstrip line 34a must be very thin, because thinner lines have higher impedance values. However, if the microstrip line 34a is too thin, it becomes very difficult to manufacture and susceptible to failure. To maintain high impedance at the point the microstrip line 34a is coupled to the slot 28a while at the same time reducing the problems associated with long thin microstrip lines, a tapered configuration is used for the microstrip line 34a. Referring to FIG. 4, the end 52 of the microstrip line coupled to the slot 28a is 24 mils in width, which provides the proper impedance match to a slot dimensioned as described above. The microstrip line 34a has a tapered section 54 where the width is gradually expanded (in the illustrated embodiment the expansion occurs over a distance of 300 mils) to a width of 100 mils. A microstrip line of 100 mils in width is easy to manufacture and not highly susceptible to failure, and also provides an impedance match with 50 ohm active devices, which are used in spatial combiners containing active devices, as described below. This taped configuration is used in all places where a slot is coupled with a microstrip line, both in the input waveguide 24 and the output waveguide 26.

A coaxial to waveguide adapter is located on both ends of the passive combiner 20. An input adapter 31 is used to couple a signal from an input coaxial cable to the input waveguide 24 and an output adapter 35 is used to couple the signal from the output waveguide 26 to an output coaxial cable. In a preferred embodiment, WR28 adapters are used, which is a standard size for a 28 GHz signal; however, various other adapters can also be used.

Figure 5:
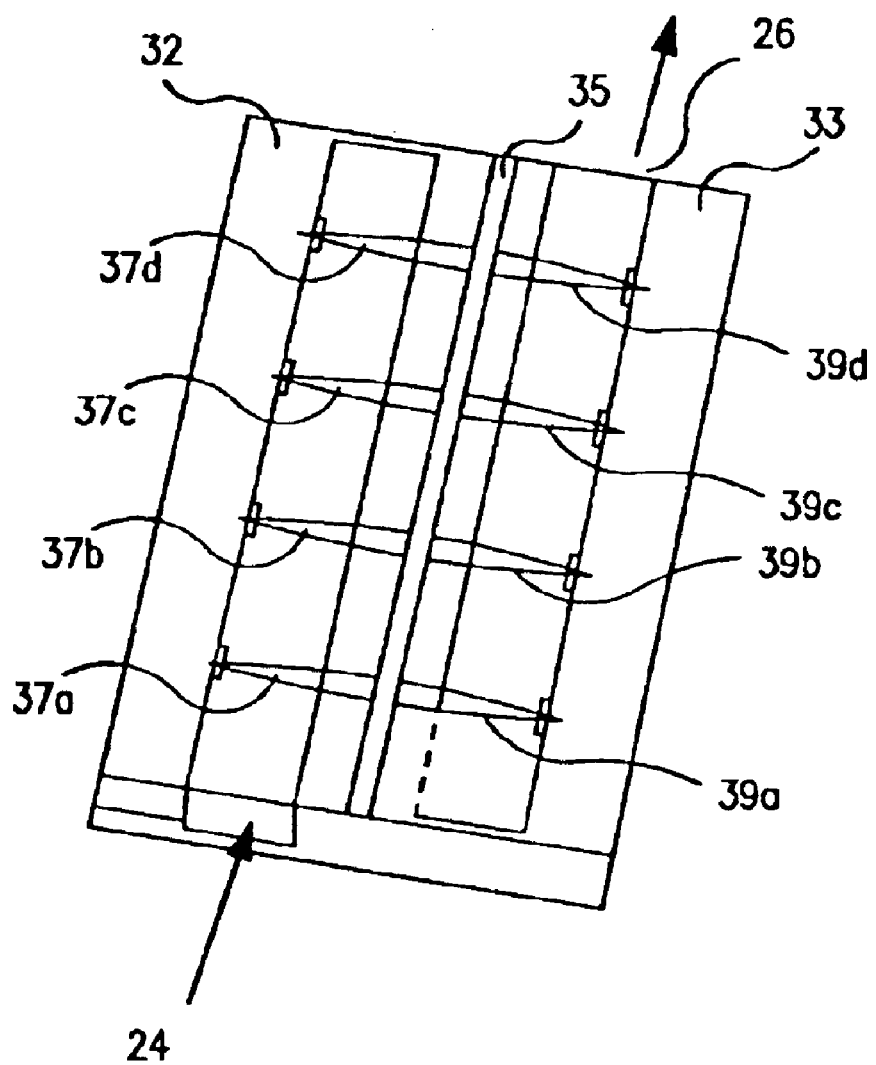
FIG. 5 is an "x-ray" view of the structure of an active spatial power amplifier in accordance with the present invention, shown without the power amplifier devices.

Active devices are added to the passive divider/combiner to create an active spatial power divider/combiner, or power amplifer ("amplifier"). Referring to FIG. 5, an amplifier using two separate boards (32, 33) to replace the single board described above is shown. For simplicity, the amplifier 50 shown in FIG. 5 is shown without showing the actual active devices. The amplifier 50 uses the same housing 22, input waveguide 24, and output waveguide 26, slot configuration (28a, 28b, 28c, 28d, 30a, 30b, 30c, 30d), and adapters (31, 35) as the passive combiner.

In the embodiment illustrated in FIG. 5, a first board 32 and a second board 33 are bonded to the housing 22. After the boards are bonded in place, the bottom side of the first board 32 acts as the top of the input waveguide 24 and the bottom side of the second board 33 acts as the top of the output waveguide 26. The other three sides of each waveguide are formed by the milled channel in the housing 22. Similar to the passive divider/combiner, the first board 32 and the second board 33 in the amplifier are bonded to the housing 22 using conductive silver-filled epoxy, although other well known bonding methods can also be used.

A slight separation 35 exists between the first board 32 and the second board 33 after the two boards are bonded to the housing 22. This allows space for active devices to be placed between the boards, as discussed further below. Alternative embodiments could use a single board comprising the top of both the input waveguide 24 and the output waveguide 26 with active devices formed directly on the top of the board, depending upon the type of active devices used.

Figure 6:
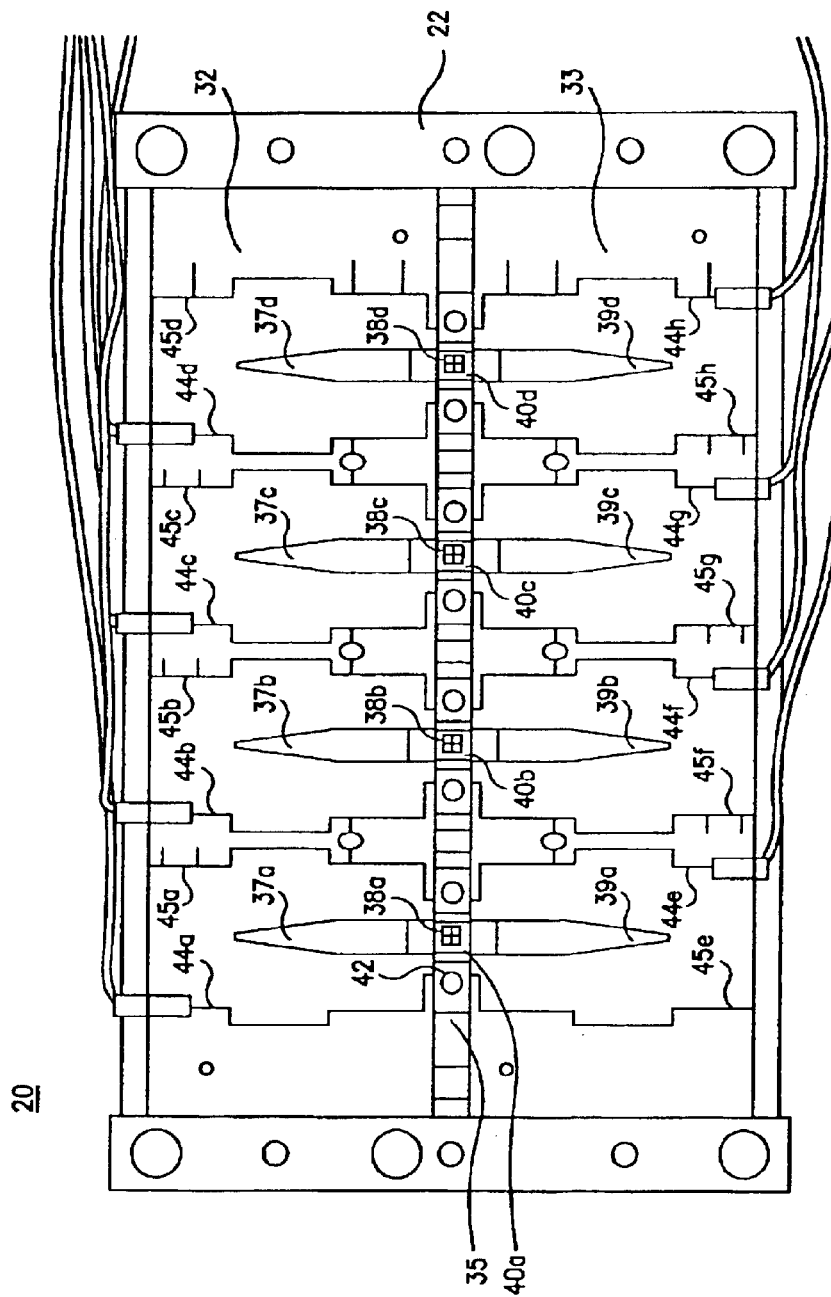
FIG. 6 is a top view of an active spatial power amplifier in accordance the present invention.

Referring to FIG. 6, a top view of an amplifier 50 is shown. In a preferred embodiment, a series of 1 watt MMIC power amplifier devices (38a, 38b, 38c, 38d) is used to amplify the signal entering the input waveguide 24. Specifically, a series of Fujitsu FMM5803X 1-Watt MMIC power amplifier devices (Fujitsu Microelectronics of America, Inc., San Jose, Calif.) is used, however, other MMIC devices could be used depending upon the application.

Because of the small size of the MMIC devices, mounting the devices directly to the amplifier 50 is a difficult task. To overcome this problem, each MMIC device (38a, 38b, 38c, 38d) is mounted onto a carrier plate (40a, 40b, 40c, 40d), preferably using solder comprising an AuSn alloy. In a preferred embodiment, the carrier plates (40a, 40b, 40c, 40d) are made from copper tungsten material. The copper tungsten material has a coefficient of expansion similar to the MMIC devices, and copper tungsten also provides good thermal conductivity. Each copper tungsten carrier plate (40a, 40b, 40c, 40d) contains two mounting holes 42. The carrier plates are then mounted to the housing 22 using screws. The carrier plates are mounted in a position such that the MMIC devices (38a, 38b, 38c, 38d) are located between the first board 32 and the second board 33. The MMIC devices are very thin, having a thickness of approximately 1 mil. In a preferred embodiment, the MMIC devices (38a, 38b, 38c, 38d) have x and y dimensions of approximately 3.34 mm ×2.08 mm. The number of MMIC devices corresponds to the number of subsignals the input signal into which the input signal is divided.

The first board 32 and the second board 33 each contain a series of microstrip lines (37a, 37b, 37c, 37d and 39a, 39b, 39c, 39d, respectively). The MMIC devices are coupled to the microstrip lines using 1 mil bond wires, preferably gold bond wires. The microstrip lines (37a, 37b, 37c, 37d) on the first board 32 carry the divided signal from the input waveguide 24 to the MMIC devices, and the microstrip lines (39a, 39b, 39c, 39d) located on the second board 33 carry the amplified signal from the MMIC devices to the output waveguide 26 where the signal is recombined into a single signal.

The MMIC devices (38a, 38b, 38c, 38d) are mounted on the carrier plates (40a, 40b, 40c, 40d) using AuSn eutectic preforms, preferably 80% Au and 20% Sn, to create a solder bond between the MMIC devices (38a, 38b, 38c, 38d) and the carrier plates (40a, 40b, 40c, 40d). Using this process ensures efficient removal of excess heat. Wedge bonded gold wires, preferably 0.7 mils to 1.0 mils in diameter, are used to make surface connection between the devices and DC traces on printed the first board 32 and the second board 33. A first series of DC traces (44a, 44b, 44c, 44d, 44e, 44f, 44g, 44h) provide contact to power and a second series of DC traces (45a, 45b, 45c, 45d, 45e, 45f, 45g, 45h) provide contact to drain.

The individual MMIC devices provide a power output of approximately 31.8 dBm. Combining four such devices absent any loss would yield a calculated output power of 37.6 dBm. Using the amplifier amplification in accordance with the present invention, a measured power output of 36.8 dBm was achieved. Thus, there was only a 1 dB loss in the power amplifier. The power amplifier in accordance with the present invention provided a measured gain of approximately 11 dB.

A measured power combining efficiency of about 80 percent (i.e., the amplitude of the output signal is about 80% of the amplitude of the input signal) was achieved using an active spatial combiner 40 in accordance with a preferred embodiment of the present invention. The active spatial combiner in accordance with the present invention allows for high efficiency power combining in a small, low profile device. Power combination can be performed efficiently for high frequency millimeter wave signals (i.e., 28 GHz).

It should be understood that the foregoing is illustrative and not limiting and that obvious modifications may be made by those skilled in the art without departing from the spirit of the invention. Accordingly, the specification is intended to cover such alternatives, modifications, and equivalents as may be included within the spirit and scope of the invention as defined in the following claims.

What is claimed is:

1. A spatial power divider/combiner, comprising:
   a housing having a first channel and a second channel;
   at least one board having a top side and an underside, said underside of said board coupled to said housing;
   a input waveguide formed by said first channel and the underside of said at least one board for receiving an input signal;
   a output waveguide formed by said second channel and the underside of said at least one board for outputting an output signal;
   a plurality of microstrip lines formed on said at least one board;
   a first series of slots formed on said underside of said at least one board in said input waveguide for dividing an input signal into a plurality of divided signals, wherein each slot of said first series of slots is coupled to one microstrip line; and
   a second series of slots formed on said underside of said at least one board in said output waveguide for combining a plurality of divided signals, wherein each slot of said second series of slots is coupled to one microstrip line.

2. A divider/combiner as set forth in claim 1, wherein said input waveguide and said output waveguide are rectangular waveguides.

3. A divider/combiner as set forth in claim 1, wherein said plurality of microstrip lines are formed on the top side of said at least one board.

4. A divider/combiner as set forth in claim 1, wherein said plurality of microstrip lines each have at least one tapered end, wherein said tapered end is coupled to a slot from said first series of slots or said second series of slots.

5. A divider/combiner as set forth in claim 4, wherein the impedance of each slot of said first series or said second series of slots is matched to the impedance of said at least one tapered end of said microstrip line coupled to the respective slot.

6. A divider/combiner as set forth in claim 1, further comprising:
   a plurality of active devices, said active devices used to process said plurality of divided signals.

7. A divider/combiner as set forth in claim 6, wherein said at least one board comprises a first board and a second board.

8. A divider/combiner as set forth in claim 7, wherein a separation is provided between said first board and said second board.

9. A divider/combiner as set forth in claim 8, wherein each device of said plurality of active devices is mounted to said housing in said separation.

10. A divider/combiner as set forth in claim 7, wherein each device of said plurality of active devices is mounted to a carrier plate, and said carrier plate is mounted to said housing.

11. A divider/combiner as set forth in claim 10, wherein said carrier plate comprises copper tungsten material.

12. A divider/combiner as set forth in claim 7, wherein said plurality of microstrip lines comprises a first plurality of microstrip lines on the top side of said first board and a second plurality of microstrip lines on the top side of said second board.

13. A divider/combiner as set forth in claim 12, wherein said first plurality and said second plurality of microstrip lines each have at least one tapered end, wherein said at least one tapered end is coupled to a slot from said first series of slots or said second series of slots.

14. A divider/combiner as set forth in claim 13, wherein the impedance of each slot of said first series or said second series of slots is matched to the impedance of said at least one tapered end of said microstrip line coupled to the respective slot.

15. A divider/combiner as set forth in claim 6, wherein a gain of approximately 7 dBm is measured from said input signal to said output signal.

16. A divider/combiner as set forth in claim 6, wherein said plurality of active devices comprises a series of MMIC power amplifiers.

17. A divider/combiner as set forth in claim 1, wherein the amplitude of said output signal is approximately 80% of the amplitude of said input signal.

18. A spatial power coupler, comprising:
    a housing having a channel;
    at least one board having a top side and an underside, said underside of said board coupled to said housing;
    a waveguide formed by said channel and the underside of said at least one board;
    a plurality of microstrip lines formed on said at least one board;
    a series of slots formed on said underside of said at least one board in said waveguide, wherein each slot of said series of slots is coupled to one microstrip line.

19. A spatial power coupler as set forth in claim 18, further comprising a plurality of active devices electrically connected to said plurality of microstrip lines.

20. A spatial power coupler as set forth in claim 19, wherein each device of said plurality of active devices is mounted to said housing.

21. A spatial power coupler as set forth in claim 19, wherein each device of said plurality of active devices is mounted to a carrier plate, and said carrier plate is mounted to said housing.

22. A spatial power coupler as set forth in claim 21, wherein said carrier plate comprises copper tungsten material.

23. A spatial power coupler as set forth in claim 19, wherein said plurality of active devices comprises a series of MMIC power amplifiers.

24. A spatial power coupler as set forth in claim 18, wherein said waveguide is a rectangular waveguide.

25. A spatial power coupler as set forth in claim 18, wherein said plurality of microstrip lines are formed on the top side of said at least one board.

26. A spatial power coupler as set forth in claim 18, wherein said plurality of microstrip lines each have at least one tapered end, wherein said tapered end is coupled to a slot from said series of slots.

27. A spatial power coupler as set forth in claim 26, wherein the impedance of each slot of said series of slots is matched to the impedance of said at least one tapered end of said microstrip line coupled to the respective slot.

28. A spatial power coupler as set forth in claim 18, wherein said waveguide is an input waveguide and said microstrip lines are output microstrip lines, such that the spatial power coupler is a power splitter.

29. A spatial power coupler as set in claim 18, wherein said microstrip lines are input microstrip lines and said waveguide is an output waveguide, such that the spatial power coupler is a power combiner.

* * * * *